US010123286B2

(12) United States Patent
Khlat et al.

(10) Patent No.: US 10,123,286 B2
(45) Date of Patent: Nov. 6, 2018

(54) OUTPHASING POWER MANAGEMENT CIRCUIT FOR RADIO FREQUENCY (RF) BEAMFORMING

(71) Applicant: Qorvo US, Inc., Greensboro, NC (US)

(72) Inventors: Nadim Khlat, Cugnaux (FR); Alexander Wayne Hietala, Phoenix, AZ (US)

(73) Assignee: Qorvo US, Inc., Greensboro, NC (US)

( * ) Notice: Subject to any disclaimer, the term of this patent is extended or adjusted under 35 U.S.C. 154(b) by 37 days.

(21) Appl. No.: 15/479,956

(22) Filed: Apr. 5, 2017

(65) Prior Publication Data

US 2018/0007645 A1 Jan. 4, 2018

Related U.S. Application Data

(60) Provisional application No. 62/356,755, filed on Jun. 30, 2016.

(51) Int. Cl.
| | |
|---|---|
| H04W 52/42 | (2009.01) |
| H04B 7/06 | (2006.01) |
| H04L 27/02 | (2006.01) |
| H04B 1/04 | (2006.01) |
| H04B 10/50 | (2013.01) |
| H04B 17/11 | (2015.01) |

(52) U.S. Cl.
CPC .......... *H04W 52/42* (2013.01); *H04B 7/0617* (2013.01); *H04L 27/02* (2013.01); *H04B 1/0458* (2013.01); *H04B 10/50577* (2013.01); *H04B 10/50597* (2013.01); *H04B 17/11* (2015.01)

(58) Field of Classification Search
CPC ..... H04W 52/42; H04W 52/00; H04W 52/52; H04L 27/02; H04B 7/0617; H04B 7/0897; H04B 3/548; H04B 1/1607; H04B 1/0458; H04B 10/50577; H04B 10/50597; H04B 10/6165; H04B 17/11
See application file for complete search history.

(56) References Cited

U.S. PATENT DOCUMENTS

| | | | |
|---|---|---|---|
| 8,031,804 B2 * | 10/2011 | Sorrells | H03F 1/0205 375/229 |
| 2005/0248401 A1 * | 11/2005 | Hellberg | H03F 1/0294 330/124 R |

(Continued)

*Primary Examiner* — Warner Wong
(74) *Attorney, Agent, or Firm* — Withrow & Terranova, P.L.L.C.

(57) ABSTRACT

An outphasing power management circuit for radio frequency (RF) beamforming is disclosed. The outphasing power management circuit includes a first outphasing amplifier branch consisting of a plurality of first power amplifiers and a second outphasing amplifier branch consisting of a plurality of second power amplifiers. A controller operates the first outphasing amplifier branch and the second outphasing amplifier branch as a pair of outphasing power amplifiers. The first outphasing amplifier branch generates a plurality of first output signals, and the second outphasing amplifier branch generates a plurality of second output signals. The first output signals and the second output signals are transmitted in an RF beam without being combined. As such, it is possible to support RF beamforming with a reduced number of power amplifiers and/or direct current (DC) to DC converters, thus helping to improve efficiency and reduce cost.

20 Claims, 4 Drawing Sheets

(56) References Cited

U.S. PATENT DOCUMENTS

| | | | | |
|---|---|---|---|---|
| 2006/0114060 A1* | 6/2006 | Hellberg | ............... | H03F 1/0205 |
| | | | | 330/124 R |
| 2007/0080747 A1* | 4/2007 | Klingberg | ............. | H03F 1/0294 |
| | | | | 330/124 R |
| 2010/0031968 A1* | 2/2010 | Sheikh | .................. | A24F 47/008 |
| | | | | 131/347 |
| 2011/0135035 A1* | 6/2011 | Bose | ....................... | H04L 27/36 |
| | | | | 375/300 |
| 2014/0118063 A1* | 5/2014 | Briffa | ........................ | H03F 1/32 |
| | | | | 330/124 R |
| 2014/0334531 A1* | 11/2014 | Jeckeln | ................... | H04L 25/06 |
| | | | | 375/240 |
| 2015/0295540 A1* | 10/2015 | Muir | ...................... | H03F 3/193 |
| | | | | 330/295 |
| 2015/0303961 A1* | 10/2015 | Banerjee | ................ | H03F 3/211 |
| | | | | 375/287 |
| 2015/0365052 A1* | 12/2015 | Barton | ..................... | H03F 1/56 |
| | | | | 330/295 |

\* cited by examiner

OUTPHASING POWER MANAGEMENT CIRCUIT FOR RADIO FREQUENCY (RF) BEAMFORMING

PRIORITY APPLICATIONS

This application claims the benefit of provisional patent application Ser. No. 62/356,755, filed Jun. 30, 2016, the disclosure of which is hereby incorporated herein by reference in its entirety.

FIELD OF THE DISCLOSURE

The technology of the disclosure relates generally to radio frequency (RF) beamforming.

BACKGROUND

Mobile communication devices have become increasingly common in current society. The prevalence of these mobile communication devices is driven in part by the many functions that are now enabled on such devices. Demand for such functions increases processing capability requirements for mobile communication devices. As a result, increasingly complex integrated circuits (ICs) have been designed and manufactured to provide increasingly greater functionality in mobile communication devices.

Modern wireless communication networks, such as long-term evolution (LTE), use multiple-input multiple-output (MIMO) technology to achieve high data rates. As a special MIMO application, beamforming is often utilized to enhance radio frequency (RF) signal strength in a targeted RF coverage area(s) and/or for a targeted mobile communication device(s) by forming an RF beam(s) from multiple antennas and steering the RF beam(s) toward the targeted RF coverage area(s) and/or the targeted mobile communication device(s). In this regard, beamforming makes it possible to enhance RF coverage in the targeted coverage area(s), thus helping to provide higher data rates to the targeted mobile communication device(s) located in the targeted coverage area(s).

SUMMARY

Aspects disclosed in the detailed description include an outphasing power management circuit for radio frequency (RF) beamforming. The outphasing power management circuit includes a first outphasing amplifier branch consisting of a plurality of first power amplifiers and a second outphasing amplifier branch consisting of a plurality of second power amplifiers. A controller operates the first outphasing amplifier branch and the second outphasing amplifier branch as a pair of outphasing power amplifiers. Accordingly, the controller deconstructs an amplitude modulated signal into a positive term signal and a negative term signal, and provides the positive term signal and the negative term signal to the first outphasing amplifier branch and the second outphasing amplifier branch, respectively. The first outphasing amplifier branch generates a plurality of first output signals based on the positive term signal, and the second outphasing amplifier branch generates a plurality of second output signals based on the negative term signal. The first output signals and the second output signals are transmitted in an RF beam without being combined. As such, it is possible to support RF beamforming with a reduced number of power amplifiers and/or direct current (DC) to DC converters, thus helping to improve efficiency and reduce cost.

In one aspect, an outphasing power management circuit is provided. The outphasing power management circuit includes a first outphasing amplifier branch including a plurality of first power amplifiers coupled to a plurality of first antenna paths, respectively. The outphasing power management circuit also includes a second outphasing amplifier branch including a plurality of second power amplifiers coupled to a plurality of second antenna paths, respectively. The outphasing power management circuit also includes a controller. The controller is configured to deconstruct an amplitude modulated signal having a time-varying amplitude into a positive term signal having a first signal amplitude and a negative term signal having a second signal amplitude. The controller is also configured to provide the positive term signal and the negative term signal to the first outphasing amplifier branch and the second outphasing amplifier branch, respectively. The plurality of first power amplifiers is configured to generate a plurality of first output signals corresponding to a first output amplitude based on the positive term signal. The plurality of first power amplifiers is also configured to provide the plurality of first output signals to the plurality of first antenna paths, respectively, for transmission in an RF beam. The plurality of second power amplifiers is configured to generate a plurality of second output signals corresponding to a second output amplitude based on the negative term signal. The plurality of second power amplifiers is also configured to provide the plurality of second output signals to the plurality of second antenna paths, respectively, for transmission in the RF beam.

In another aspect, a wireless communication system is provided. The wireless communication system includes a transmitting device including an outphasing power management circuit. The outphasing power management circuit includes a first outphasing amplifier branch including a plurality of first power amplifiers coupled to a plurality of first antenna paths, respectively. The outphasing power management circuit also includes a second outphasing amplifier branch including a plurality of second power amplifiers coupled to a plurality of second antenna paths, respectively. The outphasing power management circuit also includes a controller. The controller is configured to deconstruct an amplitude modulated signal having a time-varying amplitude into a positive term signal having a first signal amplitude and a negative term signal having a second signal amplitude. The controller is also configured to provide the positive term signal and the negative term signal to the first outphasing amplifier branch and the second outphasing amplifier branch, respectively. The plurality of first power amplifiers is configured to generate a plurality of first output signals corresponding to a first output amplitude based on the positive term signal. The controller is also configured to provide the plurality of first output signals to the plurality of first antenna paths, respectively, for transmission in an RF beam. The plurality of second power amplifiers is configured to generate a plurality of second output signals corresponding to a second output amplitude based on the negative term signal. The plurality of second power amplifiers is also configured to provide the plurality of second output signals to the plurality of second antenna paths, respectively, for transmission in the RF beam. The wireless communication system also includes a receiving device. The receiving device is configured to receive the plurality of first output signals and the plurality of second output signals via a beamforming antenna. The receiving device is also configured to reconstruct the amplitude modulated signal by combining the plurality of first output signals and the plurality of second output signals.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element, or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include an outphasing power management circuit for radio frequency (RF) beamforming. The outphasing power management circuit includes a first outphasing amplifier branch consisting of a plurality of first power amplifiers and a second outphasing amplifier branch consisting of a plurality of second power amplifiers. A controller operates the first outphasing amplifier branch and the second outphasing amplifier branch as a pair of outphasing power amplifiers. Accordingly, the controller deconstructs an amplitude modulated signal into a positive term signal and a negative term signal, and provides the positive term signal and the negative term signal to the first outphasing amplifier branch and the second outphasing amplifier branch, respectively. The first outphasing amplifier branch generates a plurality of first output signals based on the positive term signal and the second outphasing amplifier branch generates a plurality of second output signals based on the negative term signal. The first output signals and the second output signals are transmitted in an RF beam without being combined. As such, it is possible to support RF beamforming with reduced number of power amplifiers and/or direct current (DC) to DC converters, thus helping to improve efficiency and reduce cost.

Figure 1:
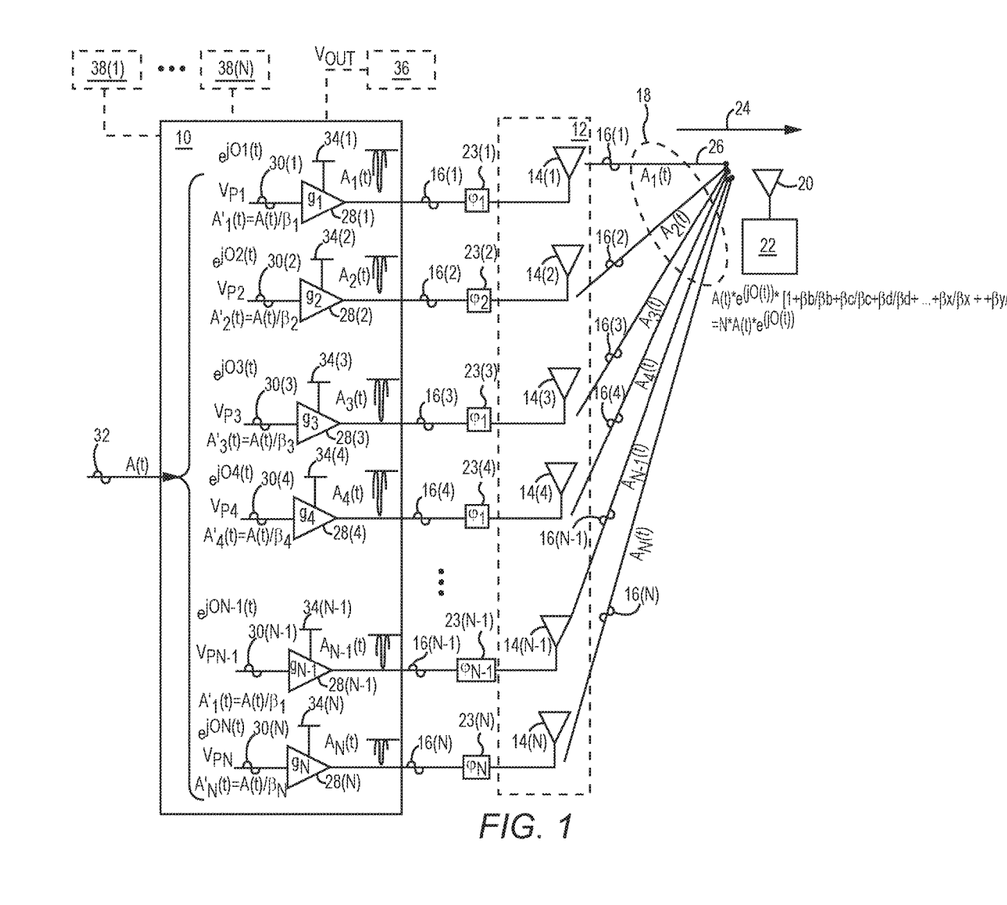
FIG. 1 is a schematic diagram of an exemplary conventional power management circuit configured to support radio frequency (RF) beamforming from an antenna array.
Figures 2A, 2B:
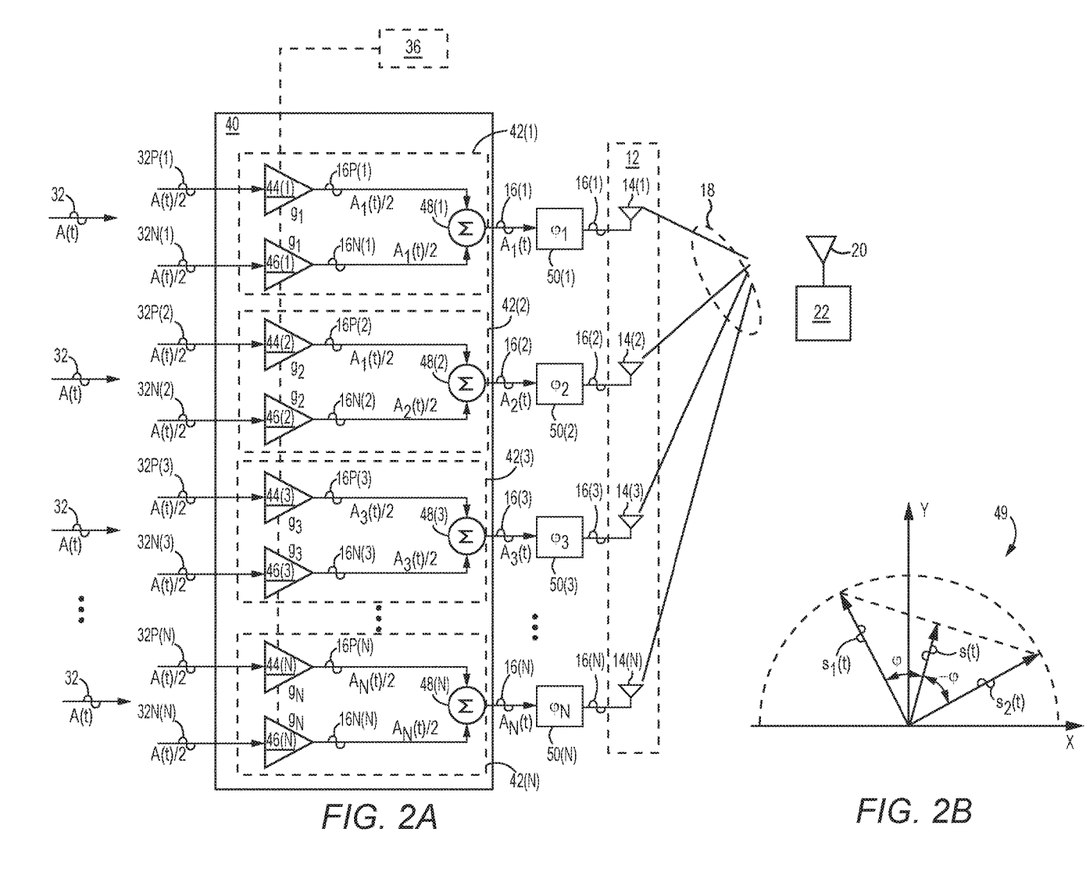
FIG. 2A is a schematic diagram of an exemplary conventional outphasing power management circuit including a plurality of outphasing amplifier circuits configured to support RF beamforming from the antenna array of FIG. 1.
FIG. 2B is a polar coordinate system providing an exemplary illustration of an input signal, a positive term signal, and a negative term signal that are processed by each of the outphasing amplifier circuits of FIG. 2A.

Before discussing the power management circuit of the present disclosure, a brief overview of a conventional beamforming power management circuit and a conventional outphasing power amplifier circuit are first provided with references to FIG. 1 and FIGS. 2A-2B, respectively. The discussion of specific exemplary aspects of a power management circuit for RF beamforming starts below with reference to FIG. 3.

FIG. 1 is a schematic diagram of an exemplary conventional power management circuit 10 configured to support RF beamforming from an antenna array 12. The antenna array 12 includes a plurality of RF antennas 14(1)-14(N) configured to transmit a plurality of RF signals 16(1)-16(N), respectively. Together, the RF signals 16(1)-16(N) form an RF beam 18, which is steered toward a receiving antenna 20 in a receiving device 22.

Notably, the RF signals 16(1)-16(N) can propagate from the RF antennas 14(1)-14(N) to the receiving antenna 20 via different propagation paths. In this regard, some of the propagation paths may be longer than the others. As a result, the RF signals 16(1)-16(N) may arrive at the receiving antenna 20 at different times. Consequently, the RF signals 16(1)-16(N) may be out of phase at the receiving antenna 20, thus unable to be constructively combined. In this regard, to control direction and maximize beamforming gain of the RF beam 18 transmitted from the RF antennas 14(1)-14(N), respective phases $\varphi_1$-$\varphi_N$ and time-varying amplitudes $A_1(t)$-$A_N(t)$ of the RF signals 16(1)-16(N) are manipulated prior to being transmitted from the RF antennas 14(1)-14(N). In a non-limiting example, a plurality of phase shifters 23(1)-23(N) can be employed to adjust the respective phases $\varphi_1$-$\varphi_N$ of the RF signals 16(1)-16(N), respectively, to ensure that the RF signals 16(1)-16(N) can be constructively combined at the receiving device 22. In this regard, the phases $\varphi_1$-$\varphi_N$ are determined to compensate for propagation phase variations in the RF signals 16(1)-16(N) to provide phase coherency among the RF signals 16(1)-16(N) at the receiving antenna 20. In addition, the time-varying amplitudes $A_1(t)$-$A_N(t)$ of the RF signals 16(1)-16(N) also need to be substantially similar at the receiving antenna 20 to enable constructive combining of the RF signals 16(1)-16(N) by the receiving device 22.

Given that the RF signals 16(1)-16(N) transmitted from the RF antennas 14(1)-14(N) can take different radiation paths to arrive at the receiving antenna 20, the RF signals 16(1)-16(N) may be subject to different propagation gains or losses when arriving at the receiving antenna 20. As such, to ensure that the time-varying amplitudes $A_1(t)$-$A_N(t)$ of the RF signals 16(1)-16(N) are substantially similar at the receiving antenna 20, the time-varying amplitudes $A_1(t)$-$A_N(t)$ of the RF signals 16(1)-16(N) need to be adjusted to compensate for different propagation gains or losses, prior to being transmitted from the RF antennas 14(1)-14(N). In a non-limiting example, the time-varying amplitudes $A_1(t)$-$A_N(t)$ of the RF signals 16(1)-16(N) can be adjusted by assigning beamforming amplitude correction terms $\beta_1$-$\beta_N$ to the RF signals 16(1)-16(N), respectively.

The conventional power management circuit 10 includes a plurality of power amplifiers 28(1)-28(N) configured to amplify a plurality of RF input signals 30(1)-30(N) to generate the RF signals 16(1)-16(N), respectively. The power amplifiers 28(1)-28(N) are configured to provide a plurality of power gains $g_1$-$g_N$, respectively. In a non-limiting example, the power gains $g_1$-$g_N$ are substantially equal. Each of the RF input signals 30(1)-30(N) may be generated based on an amplitude modulated input signal 32. Each of the RF input signals 30(1)-30(N) has an adjusted time-varying amplitude $A'_i(t)$ ($1 \le i \le N$) that can be determined by a time-varying amplitude $A(t)$ of the amplitude modulated input signal 32 and a respective amplitude weighting $\beta'_i$ ($1 \le i \le N$), as shown in the equation (Eq. 1) below. In exemplary aspects discussed herein, the time-varying amplitude $A(t)$ refers to an amplitude of a signal (e.g., a sinusoid signal) that changes over time.

$$A'_i(t) = A(t)/\beta_i, \quad (1 \le i \le N) \qquad (1)$$

Based on the equation (Eq. 1) above, the adjusted time-varying amplitude $A'_1(t)$ of the RF input signal 30(1) equals $A(t)/\beta_1$, the adjusted time-varying amplitude $A'_2(t)$ of the RF input signal 30(2) equals $A(t)/\beta_2$, and the adjusted time-varying amplitude $A'_N(t)$ of the RF input signal 30(N) equals $A(t)/\beta_N$. Accordingly, the adjusted time-varying amplitude $A'_i(t)$ corresponding to each of the RF input signals 30(1)-30(N) can be further expressed as $A'_i(t)=(A(t)/\beta_i)$ ($1 \le i \le N$).

The power amplifiers 28(1)-28(N) amplify the RF input signals 30(1)-30(N) to generate the RF signals 16(1)-16(N). As such, the time-varying amplitudes $A_1(t)$-$A_N(t)$ of the RF signals 16(1)-16(N) are determined by the adjusted time-varying amplitudes $A'_1(t)$-$A'_N(t)$ and the power gains $g_1$-$g_N$ of the power amplifiers 28(1)-28(N), respectively, as shown in equation (Eq. 2) below.

$$A_i(t) = A'_i(t) * g_i \qquad (2)$$

In this regard, by assigning the beamforming amplitude correction terms $\beta_1$-$\beta_N$ to the RF signals 16(1)-16(N), the time-varying amplitudes $A_1(t)$-$A_N(t)$ of the RF signals 16(1)-16(N) can be controlled to accommodate the different propagation gains or losses between the antenna array 12 and the receiving antenna 20. However, given that the beamforming amplitude correction terms $\beta_1$-$\beta_N$ may be different, the adjusted time-varying amplitudes $A'_1(t)$-$A'_N(t)$ of the RF input signals 30(1)-30(N) can be different from each other according to equation (Eq. 1) above. As such, the RF input signals 30(1)-30(N) can have different peak voltages $V_{P1}$-$V_{PN}$, respectively. The power amplifiers 28(1)-28(N) are configured to operate based on supply voltages 34(1)-34(N), respectively. In this regard, the supply voltages 34(1)-34(N) need to be greater than or equal to the peak voltages $V_{P1}$-$V_{PN}$ of the RF input signals 30(1)-30(N). Therefore, the supply voltages 34(1)-34(N) would need to increase or decrease to keep track of the peak voltages $V_{P1}$-$V_{PN}$.

If the supply voltages 34(1)-34(N) are provided by a single direct current (DC) to DC (DC-DC) converter 36, for example, the DC-DC converter 36 would need to provide an output voltage $V_{OUT}$ that equals the maximum peak voltage among the peak voltages $V_{P1}$-$V_{PN}$ ($V_{OUT}$=MAX($V_{P1}$-$V_{PN}$)). Notably, a power amplifier among the power amplifiers 28(1)-28(N) (e.g., the power amplifier 28(1)) would only operate at an optimal efficiency when a respective supply voltage (e.g., the supply voltage 34(1)) matches the peak voltage (e.g., $V_{P1}$) the power amplifier needs to produce. Given that some power amplifiers may receive respective RF input signals at respective peak voltages that are lower than the output voltage $V_{OUT}$, these power amplifiers would be forced to operate at suboptimal efficiencies as a result.

To help improve efficiencies of the power amplifiers 28(1)-28(N), it may be possible to employ a plurality of DC-DC converters 38(1)-38(N) to provide the supply voltages 34(1)-34(N) to the power amplifiers 28(1)-28(N), respectively. As such, the supply voltages 34(1)-34(N) for the power amplifiers 28(1)-28(N) can be determined based on the peak voltages $V_{P1}$-$V_{PN}$ of the RF input signals 30(1)-30(N), respectively. As a result, each of the power amplifiers 28(1)-28(N) can operate at an optimal efficiency. However, adding the DC-DC converters 38(1)-38(N) to the conventional power management circuit 10 can lead to significant increase in footprint and cost of the conventional power management circuit 10. In this regard, efficiency of the power amplifiers 28(1)-28(N) may be improved at the expense of increased footprint and cost.

Alternatively, it may be possible to improve efficiency of the power amplifiers 28(1)-28(N) by configuring the conventional power management circuit 10 to operate as an outphasing power amplifier. In this regard, FIG. 2A is a schematic diagram of an exemplary conventional outphasing power management circuit 40 including a plurality of outphasing amplifier circuits 42(1)-42(N) configured to support RF beamforming from the antenna array 12 of FIG. 1. Common elements between FIGS. 1 and 2A are shown therein with common element numbers and will not be re-described herein.

The outphasing amplifier circuits 42(1)-42(N) are configured to generate the RF signals 16(1)-16(N) for transmission from the antenna array 12 in the RF beam 18 based on the amplitude modulated input signal 32, which corresponds to the time-varying amplitude A(t). Each of the outphasing amplifier circuits 42(1)-42(N) functions based on a pair of power amplifiers, which can be saturated power amplifiers for example. Accordingly, the outphasing amplifier circuits 42(1)-42(N) include a plurality of first power amplifiers 44(1)-44(N) and a plurality of second power amplifiers 46(1)-46(N), respectively. The first power amplifiers 44(1)-44(N) are configured to receive a plurality of positive term signals 32P(1)-32P(N), respectively. The second power amplifiers 46(1)-46(N) are configured to receive a plurality of negative term signals 32N(1)-32N(N), respectively. The first power amplifiers 44(1)-44(N) have the power gains $g_1$-$g_N$, respectively. Likewise, the second power amplifiers 46(1)-46(N) also have the power gains $g_1$-$g_N$, respectively. The first power amplifiers 44(1)-44(N) amplify the positive term signals 32P(1)-32P(N) to generate a plurality of positive term RF signals 16P(1)-16P(N), respectively. The second power amplifiers 46(1)-46(N) amplify the negative term signals 32N(1)-32N(N) to generate a plurality of negative term RF signals 16N(1)-16N(N), respectively. The outphasing amplifier circuits 42(1)-42(N) include a plurality of combiners 48(1)-48(N), respectively. The combiners 48(1)-48(N) combine the positive term RF signals 16P(1)-16P(N) and the negative term RF signals 16N(1)-16N(N), respectively, to generate the RF signals 16(1)-16(N).

The positive term signals 32P(1)-32P(N) and the negative term signals 32N(1)-32N(N) are generated based on the amplitude modulated input signal 32. To help understand the relationship between the amplitude modulated input signal 32, the positive term signals 32P(1)-32P(N), and the negative term signals 32N(1)-32N(N), FIG. 2B is discussed next.

In this regard, FIG. 2B is a polar coordinate system 49 providing an exemplary illustration of an input signal s(t), a positive term signal $s_1(t)$, and a negative term signal $s_2(t)$ that are processed by each of the outphasing amplifier circuits 42(1)-42(N) of FIG. 2A. In a non-limiting example, the input signal s(t) can be equivalent to the amplitude modulated input signal 32 of FIG. 2A, the positive term signal $s_1(t)$ can be equivalent to any of the positive term signals 32P(1)-32P(N) of FIG. 2A, and the negative term signal $s_2(t)$ can be equivalent to any of the negative term signals 32N(1)-32N(N) of FIG. 2A.

The input signal s(t) can be expressed as $s(t)=A(t)*e^{jO(t)}$, wherein A(t) represents a time-varying amplitude of the input signal s(t). The positive term signal $s_1(t)$ has a positive phase offset φ from the input signal s(t), indicating that the positive term signal $s_1(t)$ is ahead of the input signal s(t) in the polar coordinate system 49. Accordingly, the positive term signal $s_1(t)$ can be expressed as $s_1(t)=A_P(t)*e^{jO(t)+jOm(t)}$, wherein $A_P(t)$ is the time-varying amplitude of the positive term signal $s_1(t)$, and Om(t) represents a time-varying outphasing modulation term for the positive term signal $s_1(t)$. The time-varying amplitude $A_P(t)$ of the positive term signal $s_1(t)$ equals one-half (½) of the time-varying amplitude A(t) of the input signal s(t) ($A_P(t)=½A(t)$). In contrast, the negative term signal $s_2(t)$ has a negative phase offset −φ from the input signal s(t), indicating that the negative term signal $s_2(t)$ is behind the input signal s(t) in the polar coordinate system 49. Accordingly, the negative term signal $s_2(t)$ can be expressed as $s_2(t)=A_N(t)*e^{jO(t)-jOm(t)}$, wherein $A_N(t)$ represents the time-varying amplitude of the negative term signal $s_2(t)$, and Om(t) represents the time-varying outphasing modulation term for the negative term signal $s_2(t)$. The time-varying amplitude $A_N(t)$ of the negative term signal $s_2(t)$ also equals ½ of the time-varying amplitude A(t) of the input signal s(t) ($A_N(t)=½A(t)$). The equation (Eq. 3) below summarizes the relationship between the input signal s(t), the positive term signal $s_1(t)$, and the negative term signal $s_2(t)$.

$$s(t)=A(t)*e^{jO(t)} \quad (3)$$

$$s_1(t)=½A(t)*e^{jO(t)+jOm(t)}$$

$$s_2(t)=½A(t)*e^{jO(t)-jOm(t)}$$

$$Om(t)=\cos^{-1}[A(t)/\max(A(t))] \quad (3)$$

In the equation (Eq. 3) above, max(A(t)) represents a peak of the time-varying amplitude A(t). With reference back to FIG. 2A, each of the positive term signals 32P(1)-32P(N) can thus be expressed as $½A(t)*e^{jO(t)+jOmi(t)}$ (1≤i≤N) according to the equation (Eq. 3) above, wherein Omi(t) (1≤i≤N) represents the time-varying outphasing modulation term for a positive term signal 32P(i) (1≤i≤N) among the positive term signals 32P(1)-32P(N). Likewise, each of the negative term signals 32N(1)-32N(N) can be expressed as $½A(t)*e^{jO(t)-jOmi(t)}$ (1≤i≤N) according to the equation (Eq. 3) above, wherein Omi(t) (1≤i≤N) represents the time-varying outphasing modulation term for a negative term signal 32N(i) (1≤i≤N) among the negative term signals 32N(1)-32N(N).

In contrast to the conventional power management circuit 10 of FIG. 1, the conventional outphasing power management circuit 40 can be configured to accommodate the different propagation gains or losses between the antenna array 12 and the receiving antenna 20 by providing a modified time-varying outphasing modulation term Om'i(t) (1≤i≤N) for each of the positive term signals 32P(1)-32P(N) and each of the negative term signals 32N(1)-32N(N). The modified time-varying outphasing modulation term Om'i(t) (1≤i≤N) incorporates the beamforming amplitude correction terms $β_1$-$β_N$ and can be expressed in the equation (Eq. 4) below.

$$Om'i(t)=\cos(Omi(t))=A(t)/[β_i*\max(A(t))] \quad (1≤i≤N) \quad (4)$$

Accordingly, each of the positive term signals 32P(1)-32P(N) can be expressed as $½A(t)*e^{jO(t)+jOm'i(t)}$ (1≤i≤N), and each of the negative term signals 32N(1)-32N(N) can be expressed as $½A(t)*e^{jO(t)-jOm'i(t)}$ (1≤i≤N) according to equation (Eq. 3) above. As discussed above, the positive term signals 32P(1)-32P(N) and the negative term signals 32N(1)-32N(N) are amplified by the first power amplifiers 44(1)-44(N) and the second power amplifiers 46(1)-46(N) to generate the positive term RF signals 16P(1)-16P(N) and the negative term RF signals 16N(1)-16N(N), respectively. The positive term RF signals 16P(1)-16P(N) and the negative term RF signals 16N(1)-16N(N) correspond to ½ of the time-varying amplitudes A(t). In this regard, each of the positive term RF signals 16P(1)-16P(N) can be expressed as ½A(t)*$e^{jO(t)+jOmi(t)}$ (1≤i≤N), and each of the negative term RF signals 16N(1)-16N(N) can be expressed as ½A(t)*$e^{jO(t)-jOmi(t)}$ (1≤i≤N). As such, when the positive term RF signals 16P(1)-16P(N) are respectively combined with the negative term RF signals 16N(1)-16N(N) at the combiners 48(1)-48(N), the RF signals 16(1)-16(N) will be generated as a result.

The RF signals 16(1)-16(N) are received by a plurality of phase control circuits 50(1)-50(N), respectively. The phase control circuits 50(1)-50(N) are configured to adjust the phases $\varphi^1$-$\varphi_N$ of the RF signals 16(1)-16(N) to ensure phase coherency between the RF signals 16(1)-16(N).

According to previous discussions, the time-varying amplitudes of the positive term signals 32P(1)-32P(N) and the time-varying amplitudes of the negative term signals 32N(1)-32N(N) all equal ½A(t). As such, all of the first power amplifiers 44(1)-44(N) and the second power amplifiers 46(1)-46(N) can be configured to draw supply voltages from the DC-DC converter 36, thus enabling power amplifier efficiency improvement over the conventional power management circuit 10 of FIG. 1, without adding additional DC-DC converters. However, given that each of the outphasing amplifier circuits 42(1)-42(N) functions based on a pair of power amplifiers, the conventional outphasing power management circuit 40 would require twice as many power amplifiers than the conventional power management circuit 10 of FIG. 1. As such, it may be desired to improve power amplifier efficiency in a power management circuit without requiring a large number of DC-DC converters and/or power amplifiers.

Figure 3:
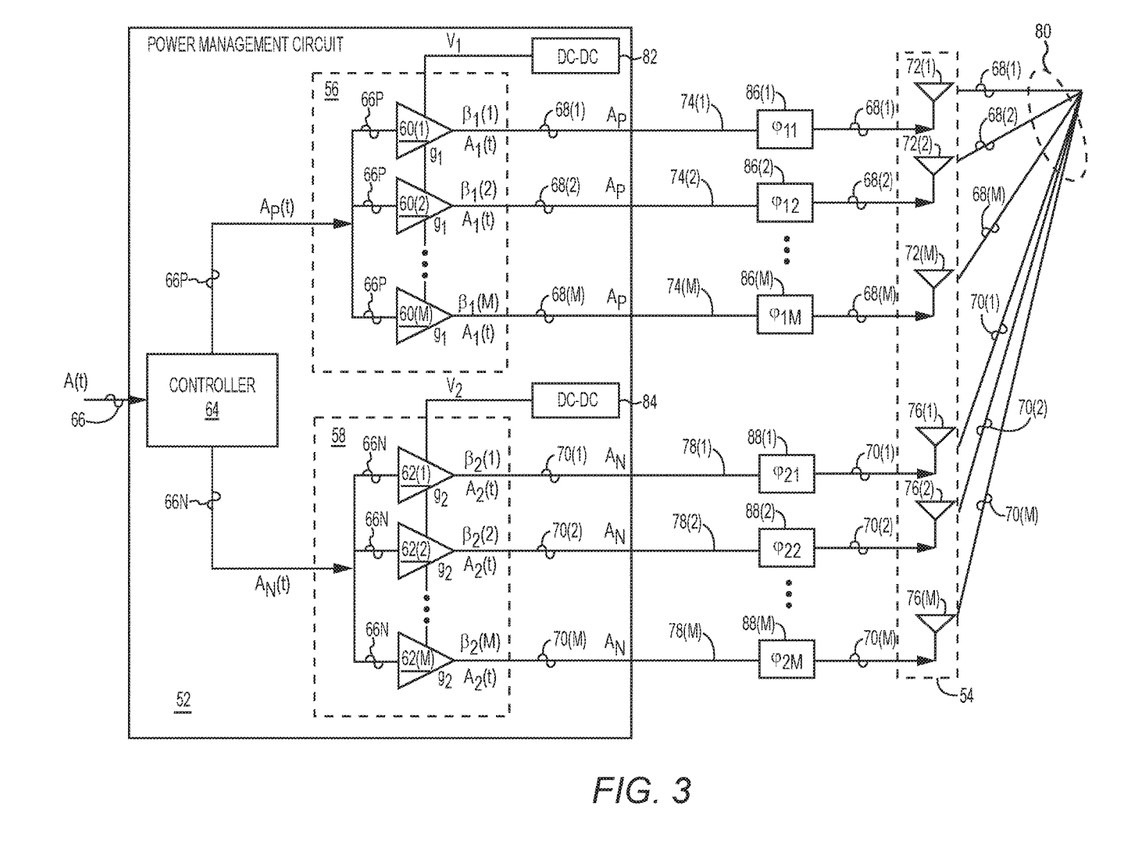
FIG. 3 is a schematic diagram of an exemplary outphasing power management circuit configured to support RF beamforming from an antenna array.

In this regard, FIG. 3 is a schematic diagram of an exemplary outphasing power management circuit 52 configured to support RF beamforming from an antenna array 54 based on operation principles of an outphasing power amplifier circuit. The outphasing power management circuit 52 includes a first outphasing amplifier branch 56 and a second outphasing amplifier branch 58. The first outphasing amplifier branch 56 includes a plurality of first power amplifiers 60(1)-60(M), and the second outphasing amplifier branch 58 includes a plurality of second power amplifiers 62(1)-62(M). In a non-limiting example, the first outphasing amplifier branch 56 and the second outphasing amplifier branch 58 include an equal number of power amplifiers. As such, the outphasing power management circuit 52 includes even number (2M) of power amplifiers.

The first power amplifiers 60(1)-60(M) and the second power amplifiers 62(1)-62(M) can be assigned to the first outphasing amplifier branch 56 and the second outphasing amplifier branch 58 in many ways. In one non-limiting example, the even number of power amplifiers can be labeled sequentially from 1 to 2M. Accordingly, the first outphasing amplifier branch 56 and the second outphasing amplifier branch 58 can be assigned with odd-labeled power amplifiers and even-labeled power amplifiers, respectively. Alternatively, the first outphasing amplifier branch 56 can be assigned with the power amplifiers labeled from 1 to M, and the second outphasing amplifier branch 58 can be assigned with the power amplifiers labeled from M+1 to 2M. It shall be appreciated other assignment methods can exist as well.

The outphasing power management circuit 52 includes a controller 64, which can be a microprocessor, a digital signal processor (DSP), or a field-programmable gate array (FPGA), for example. The controller 64 is configured to operate the first outphasing amplifier branch 56 and the second outphasing amplifier branch 58 as a pair of power amplifiers, such as the first power amplifier 44(1) and the second power amplifier 46(1) in the conventional outphasing power management circuit 40 of FIG. 2A for example. In this regard, the controller 64 deconstructs an amplitude modulated signal 66, which has a time-varying amplitude A(t), into a positive term signal 66P and a negative term signal 66N. The controller 64 provides the positive term signal 66P to each of the first power amplifiers 60(1)-60(M) in the first outphasing amplifier branch 56, and provides the negative term signal 66N to each of the second power amplifiers 62(1)-62(M) in the second outphasing amplifier branch 58. The first power amplifiers 60(1)-60(M) are configured to generate a plurality of first output signals 68(1)-68(M), respectively, based on the positive term signal 66P. Similarly, the second power amplifiers 62(1)-62(M) are configured to generate a plurality of second output signals 70(1)-70(M), respectively, based on the negative term signal 66N.

The first power amplifiers 60(1)-60(M) are coupled to a plurality of first antennas 72(1)-72(M) in the antenna array 54 via a plurality of first antenna paths 74(1)-74(M), respectively. The second power amplifiers 62(1)-62(M) are coupled to a plurality of second antennas 76(1)-76(M) in the antenna array 54 via a plurality of second antenna paths 78(1)-78(M), respectively. Accordingly, the first power amplifiers 60(1)-60(M) provide the first output signals 68(1)-68(M) to the first antenna paths 74(1)-74(M), respectively, for transmission from the antenna array 54 in an RF beam 80. Likewise, the second power amplifiers 62(1)-62(M) provide the second output signals 70(1)-70(M) to the second antenna paths 78(1)-78(M), respectively, for transmission from the antenna array 54 in the RF beam 80. Unlike any of the outphasing amplifier circuits 42(1)-42(N) in the conventional outphasing power management circuit 40 of FIG. 2A, the first output signals 68(1)-68(M) are not combined with the second output signals 70(1)-70(M) prior to being transmitted from the antenna array 54 in the RF beam 80.

The positive term signal 66P has a first signal amplitude $A_P(t)$, and the negative term signal 66N has a second signal amplitude $A_N(t)$. In a non-limiting example, the first signal amplitude $A_P(t)$ and the second signal amplitude $A_N(t)$ can be determined, respectively, based on the equations (Eq. 5.1 and Eq. 5.2) below.

$$A_P(t)=A_P*A(t) \qquad (5.1)$$

$$A_N(t)=A_N*A(t) \qquad (5.2)$$

In the equations (Eq. 5.1 and Eq. 5.2) above, $A_P$ and $A_N$ represent correction terms for the positive term signal 66P and the negative term signal 66N, respectively. The correction terms $A_P$ and $A_N$ can be determined respectively based on the equations (Eq. 6.1 and Eq. 6.2) below.

$$A_P = [M^*\max(A(t))] \bigg/ \left[\sum_{k=1}^{M} \beta_1(k)\right] \qquad (Eq.\ 6.1)$$

$$A_N = [M^*\max(A(t))] \bigg/ \left[\sum_{k=1}^{M} \beta_2(k)\right] \qquad (Eq.\ 6.2)$$

In the equations (Eq. 6.1 and Eq. 6.2) above, max(A(t)) represents a peak amplitude of the time-varying amplitude A(t) of the amplitude modulated signal 66, and $\beta_1(k)$ (1≤k≤M) represents the beamforming amplitude correction terms $\beta_1(1)$-$\beta_1(M)$ configured to compensate for propagation gains or losses for the first output signals 68(1)-68(M), respectively. Similarly, $\beta_2(k)$ (1≤k≤M) represents beamforming amplitude correction terms $\beta_2(1)$-$\beta_2(M)$ configured to compensate for propagation gains or losses for the second output signals 70(1)-70(M), respectively. The beamforming amplitude correction terms $\beta_1(1)$-$\beta_1(M)$ and the beamforming amplitude correction terms $\beta_2(1)$-$\beta_2(M)$ are so determined to align the first output amplitude (cumulative amplitude) of the first output signals 68(1)-68(M) with the second output amplitude (cumulative amplitude) of the second output signals 70(1)-70(M), thus enabling correct amplitude modulation of the first output signals 68(1)-68(M) and the second output signals 70(1)-70(M) in the RF beam 80. In one non-limiting example, according to the equations (Eq. 6.1 and Eq. 6.2) above, the correction term $A_P$ is the same as the correction term $A_N$ when a sum of the beamforming amplitude correction terms $\beta_1(1)$-$\beta_1(M)$ equals a sum of the beamforming amplitude correction terms $\beta_2(1)$-$\beta_2(M)$. In this regard, according to the equations (Eq. 5.1 and Eq. 5.2), the first signal amplitude $A_P(t)$ of the positive term signal 66P and the second signal amplitude $A_N(t)$ of the negative term signal 66N would be equal. In another non-limiting example, the correction term $A_P$ is different from the correction term $A_N$ when the sum of the beamforming amplitude correction terms $\beta_1(1)$-$\beta_1(M)$ does not equal the sum of the beamforming amplitude correction terms $\beta_2(1)$-$\beta_2(M)$. In this regard, according to the equations (Eq. 5.1 and Eq. 5.2), the first signal amplitude $A_P(t)$ of the positive term signal 66P and the second signal amplitude $A_N(t)$ of the negative term signal 66N would be different.

Given that the term max(A(t)) in the equations (Eq. 6.1 and Eq. 6.2) represents a peak amplitude of the time-varying amplitude A(t), the first signal amplitude $A_P(t)$ and the second signal amplitude $A_N(t)$ are both constant amplitudes corresponding to the peak amplitude of the time-varying amplitude A(t). In this regard, the positive term signal 66P and the negative term signal 66N are both constant-envelope signals each defined by a respective constant voltage envelope corresponding to the peak amplitude of the time-varying amplitude A(t) of the amplitude modulated signal 66.

The amplitude modulated signal 66 can be expressed as $A(t)*e^{jO(t)}$. Accordingly, the positive term signal 66P can be expressed as $A_P(t)*e^{jO(t)+jOm(t)}$, and the negative term signal 66N can be expressed as $A_N(t)*e^{jO(t)-jOm(t)}$. In a non-limiting example, the first power amplifiers 60(1)-60(M) are saturated by the respective constant voltage envelope of the positive term signal 66P. As such, a first output amplitude of the first output signals 68(1)-68(M) is determined primarily by a first supply voltage $V_1$ provided to the first power amplifiers 60(1)-60(M). Accordingly, each of the first output signals 68(1)-68(M) has a respective amplitude of $A_P$ and can be expressed as $A_P*e^{jO(t)+jOm(t)}$. In this regard, the first output amplitude of the first output signals 68(1)-68(M) is independent of the first signal amplitude $A_P(t)$ of the positive term signal 66P. Likewise, the second power amplifiers 62(1)-62(M) are be saturated by the respective constant voltage envelope of the negative term signal 66N. As such, a second output amplitude of the second output signals 70(1)-70(M) is determined primarily by a second supply voltage $V_2$ provided to the second power amplifiers 62(1)-62(M).

Accordingly, each of the second output signals 70(1)-70(M) has a respective amplitude of $A_N$ and can be expressed as $A_N*e^{jO(t)-jOm(t)}$. In this regard, the second output amplitude of the second output signals 70(1)-70(M) is independent of the second signal amplitude $A_N(t)$ of the negative term signal 66N.

The equations (Eq. 6.1 and Eq. 6.2) above can be adapted to allow the first signal amplitude $A_P(t)$ of the positive term signal 66P and the second signal amplitude $A_N(t)$ of the negative term signal 66N to be less than the peak amplitude of the time-varying amplitude A(t) (max(A(t))), as shown in the equations (Eq. 7.1 and Eq. 7.2) below.

$$A_P = [M^*sub(A(t))] / \left[\sum_{k=1}^{M}\beta_1(k)\right] \quad (\text{Eq. 7.1})$$

$$A_N = [M^*sub(A(t))] / \left[\sum_{k=1}^{M}\beta_2(k)\right] \quad (\text{Eq. 7.2})$$

In the equations (Eq. 7.1 and Eq. 7.2) above, sub(A(t)) represents an amplitude of the amplitude modulated signal 66 that is lower than the peak amplitude max(A(t)) of the amplitude modulated signal 66. As such, the correction terms $A_P$ and $A_N$ determined based on the equations (Eq. 7.1 and Eq. 7.2) are less than the correction terms $A_p$ and $A_N$ determined based on the equations (Eq. 6.1 and Eq. 6.2). In this regard, the first signal amplitude $A_P(t)$ and the second signal amplitude $A_N(t)$ are both constant amplitudes that are lower than the peak amplitude (max(A(t))) of the time-varying amplitude A(t).

Accordingly, the positive term signal 66P and the negative term signal 66N are both constant-envelope signals each defined by a respective constant voltage envelope lower than the peak amplitude of the time-varying amplitude A(t) of the amplitude modulated signal 66.

The respective constant voltage envelope of the positive term signal 66P will not saturate the first power amplifiers 60(1)-60(M). As a result, the first output amplitude of the first output signals 68(1)-68(M) will depend on respective gains $g_1$ of the first power amplifiers 60(1)-60(M). Accordingly, the first output signals 68(1)-68(M) can be expressed as $A_P(t)*g_1*e^{jO(t)+jOm(t)}$, wherein $A_P(t)*g_1$ represents the first output amplitude of the first output signals 68(1)-68(M). Likewise, the respective constant voltage envelope of the negative term signal 66N will not saturate the second power amplifiers 62(1)-62(M). As a result, the second output amplitude of the second output signals 70(1)-70(M) will depend on respective gains $g_2$ of the second power amplifiers 62(1)-62(M). Accordingly, the second output signals 70(1)-70(M) can be expressed as $A_N(t)*g_2*e^{jO(t)-jOm(t)}$, wherein $A_N(t)*g_2$ represents the second output amplitude of the second output signals 70(1)-70(M).

The outphasing power management circuit 52 can employ a first DC-DC converter 82 (shown as DC-DC in FIG. 3) to provide the first supply voltage $V_1$ to all of the first power amplifiers 60(1)-60(M). Likewise, the outphasing power management circuit 52 can employ a second DC-DC converter 84 (shown as DC-DC in FIG. 3) to provide the second supply voltage $V_2$ to all of the second power amplifiers 62(1)-62(M). As such, the outphasing power management circuit 52 is able to support RF beamforming with less DC-DC converters compared to the conventional power management circuit 10 of FIG. 1, and less power amplifiers compared to the conventional outphasing power management circuit 40 of FIG. 2A. As a result, the outphasing power management circuit 52 can support RF beamforming effectively with reduced footprint and cost. The first DC-DC converter 82 and the second DC-DC converter 84 may be configured to operate based on average power tracking (APT).

In a non-limiting example, the controller 64 can be configured to determine the first signal amplitude $A_P(t)$ of the positive term signal 66P based on the equation (Eq. 5.1) to provide amplitude correction for the first output signals 68(1)-68(M). The controller 64 is further configured to determine the correction term $A_P$ based on the beamforming amplitude correction terms $\beta_1(1)$-$\beta_1(M)$ as defined in the equation (Eq. 6.1). Similarly, the controller 64 can be configured to determine the second signal amplitude $A_N(t)$ of the negative term signal 66N based on the equation (Eq. 5.2) to provide amplitude correction for the second output signals 70(1)-70(M). The controller 64 is further configured to determine the correction term $A_N$ based on the beamforming amplitude correction terms 132(1)-132(M) as defined in the equation (Eq. 6.2). Thus, by determining the beamforming amplitude correction terms $\beta_1(1)$-$\beta_1(M)$ and the beamforming amplitude correction terms $\beta_2(1)$-$\beta_2(M)$ appropriately, it may be possible to compensate for the propagation gains or losses associated with the first output signals 68(1)-68(M) and the second output signals 70(1)-70(M). As a result, a cumulative amplitude of the first output signals 68(1)-68(M) and the second output signals 70(1)-70(M) will have the proper ratio in the RF beam 80 to enable correct amplitude modulation of the RF beam 80.

The first antenna paths 74(1)-74(M) include a plurality of first phase control circuits 86(1)-86(M), respectively. The first phase control circuits 86(1)-86(M) are configured to adjust the first output signals 68(1)-68(M) to a plurality of first output phases $\varphi_{11}$-$\varphi_{1M}$, respectively. The first output phases $\varphi_{11}$-$\varphi_{1M}$ are so determined to compensate for potential propagation phase variations among the first output signals 68(1)-68(M) that may be caused by different propagation paths. The second antenna paths 78(1)-78(M) include a plurality of second phase control circuits 88(1)-88(M), respectively. The second phase control circuits 88(1)-88(M) are configured to adjust the second output signals 70(1)-70(M) to a plurality of second output phases $\varphi_{21}$-$\varphi_{2M}$, respectively. The second output phases $\varphi_{21}$-$\varphi_{2M}$ are so determined to compensate for potential propagation phase variations among the second output signals 70(1)-70(M) that may be caused by the different propagation paths. By determining the first output phases $\varphi_{11}$-$\varphi_{1M}$ and the second output phases $\varphi_{21}$-$\varphi_{2M}$ appropriately, the controller 64 can maintain coherency between the first output phases $\varphi_{11}$-$\varphi_{1M}$ and the second output phases $\varphi_{21}$-$\varphi_{2M}$, thus enabling RF beamforming from the antenna array 54 based on the first output signals 68(1)-68(M) and the second output signals 70(1)-70(M). Accordingly, the first antennas 72(1)-72(M) can transmit the first output signals 68(1)-68(M), respectively, based on the first signal amplitude $A_P(t)$ and the first output phases $\varphi_{11}$-$\varphi_{1M}$. Likewise, the second antennas 76(1)-76(M) can transmit the second output signals 70(1)-70(M), respectively, based on the second signal amplitude $A_N(t)$ and the second output phases $\varphi_{21}$-$\varphi_{2M}$.

Figure 4:
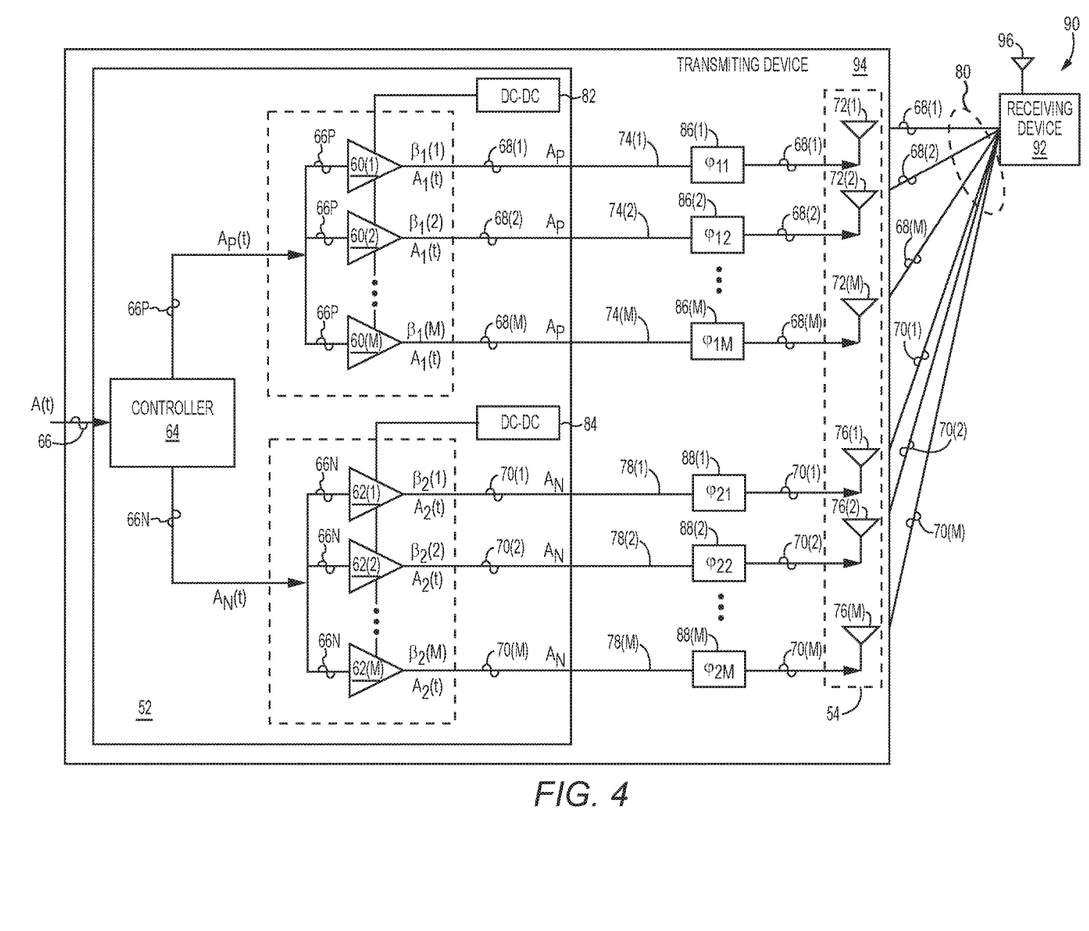
FIG. 4 is a schematic diagram of an exemplary wireless communication system in which a receiving device can be configured to reconstruct an amplitude modulated signal based on output signals received in an RF beam.

As previously discussed, the first output signals 68(1)-68(M) are not combined with the second output signals 70(1)-70(M) prior to being transmitted from the antenna array 54 in the RF beam 80. In a non-limiting example, the first output signals 68(1)-68(M) and the second output signals 70(1)-70(M) can be combined to reconstruct the amplitude modulated signal 66 at a receiving device. In this regard, FIG. 4 is a schematic diagram of an exemplary wireless communication system 90 in which a receiving device 92 can be configured to reconstruct the amplitude modulated signal 66 based on the first output signals 68(1)-68(M) and the second output signals 70(1)-70(M) received in the RF beam 80. Common elements between FIGS. 3 and 4 are shown therein with common element numbers and will not be re-described herein.

The wireless communication system 90 includes a transmitting device 94, which includes the outphasing power management circuit 52. The transmitting device 94 transmits the first output signals 68(1)-68(M) and the second output signals 70(1)-70(M) in the RF beam 80. The receiving device 92 receives the first output signals 68(1)-68(M) and the second output signals 70(1)-70(M) via a beamforming antenna 96. The receiving device 92 then reconstructs the amplitude modulated signal 66 by combining the first output signals 68(1)-68(M) and the second output signals 70(1)-70(M). In a non-limiting example, the receiving device 92 can reconstruct the amplitude modulated signal 66 by combining the first output signals 68(1)-68(M) and the second output signals 70(1)-70(M) according to equation (Eq. 7) below.

$$A(t)^* \left[ \left( A_P^* e^{jO(t)+jOm(t)*} \sum_{k=1}^{M} \beta_1(k) \right) + A_N^* e^{jO(t)-jOm(t)*} \sum_{k=1}^{M} \beta_2(k) \right] \quad \text{(Eq. 7)}$$

Those skilled in the art will recognize improvements and modifications to the preferred embodiments of the present disclosure. All such improvements and modifications are considered within the scope of the concepts disclosed herein and the claims that follow.

What is claimed is:

1. An outphasing power management circuit, comprising:
a first outphasing amplifier branch comprising a plurality of first power amplifiers coupled to a plurality of first antenna paths, respectively;
a second outphasing amplifier branch comprising a plurality of second power amplifiers coupled to a plurality of second antenna paths, respectively; and
a controller configured to:
  deconstruct an amplitude modulated signal having a time-varying amplitude into a positive term signal having a first signal amplitude and a negative term signal having a second signal amplitude; and
  provide the positive term signal and the negative term signal to the first outphasing amplifier branch and the second outphasing amplifier branch, respectively;
wherein the plurality of first power amplifiers is configured to:
  generate a plurality of first output signals corresponding to a first output amplitude based on the positive term signal; and
  provide the plurality of first output signals to the plurality of first antenna paths, respectively, for transmission in a radio frequency (RF) beam;
wherein the plurality of second power amplifiers is configured to:
  generate a plurality of second output signals corresponding to a second output amplitude based on the negative term signal; and
  provide the plurality of second output signals to the plurality of second antenna paths, respectively, for transmission in the RF beam.

2. The outphasing power management circuit of claim 1, wherein the plurality of first output signals is not combined with the plurality of second output signals prior to being transmitted in the RF beam.

3. The outphasing power management circuit of claim 1, wherein the positive term signal and the negative term signal are constant-envelope signals each defined by a respective constant voltage envelope corresponding to a peak amplitude of the time-varying amplitude of the amplitude modulated signal.

4. The outphasing power management circuit of claim 3, wherein:
the plurality of first power amplifiers is configured to be saturated by the respective constant voltage envelope of the positive term signal; and
the plurality of second power amplifiers is configured to be saturated by the respective constant voltage envelope of the negative term signal.

5. The outphasing power management circuit of claim 4, wherein:
the first output amplitude of the plurality of first output signals is determined by a first supply voltage provided to the plurality of first power amplifiers; and
the second output amplitude of the plurality of second output signals is determined by a second supply voltage provided to the plurality of second power amplifiers.

6. The outphasing power management circuit of claim 5, further comprising:
a first direct current (DC) to DC (DC-DC) converter configured to provide the first supply voltage to the plurality of first power amplifiers; and
a second DC-DC converter configured to provide the second supply voltage to the plurality of second power amplifiers.

7. The outphasing power management circuit of claim 6, wherein the first DC-DC converter and the second DC-DC converter are configured to operate based on average power tracking (APT).

8. The outphasing power management circuit of claim 3, wherein the first signal amplitude of the positive term signal equals the second signal amplitude of the negative term signal.

9. The outphasing power management circuit of claim 1, wherein the controller is further configured to:
determine the first signal amplitude of the positive term signal that provides amplitude correction for the plurality of first output signals; and
determine the second signal amplitude of the negative term signal that provides amplitude correction for the plurality of second output signals.

10. The outphasing power management circuit of claim 9, wherein the controller is configured to:
determine the first signal amplitude based on beamforming amplitude correction terms of the plurality of first output signals; and
determine the second signal amplitude based on beamforming amplitude correction terms of the plurality of second output signals.

11. The outphasing power management circuit of claim 1, wherein:
the plurality of first antenna paths comprises a plurality of first phase control circuits, respectively, the plurality of first phase control circuits configured to adjust the plurality of first output signals to a plurality of first output phases, respectively; and
the plurality of second antenna paths comprises a plurality of second phase control circuits, respectively, the plurality of second phase control circuits configured to adjust the plurality of second output signals to a plurality of second output phases, respectively.

12. The outphasing power management circuit of claim 11, wherein the controller is further configured to maintain coherency between the plurality of first output phases and the plurality of second output phases to enable RF beamforming based on the plurality of first output signals and the plurality of second output signals.

13. The outphasing power management circuit of claim 12, wherein:
the plurality of first antenna paths is coupled to a plurality of first antennas configured to transmit the plurality of first output signals in the RF beam, respectively, based on the first signal amplitude and the plurality of first output phases; and
the plurality of second antenna paths is coupled to a plurality of second antennas configured to transmit the plurality of second output signals in the RF beam, respectively, based on the second signal amplitude and the plurality of second output phases.

14. The outphasing power management circuit of claim 1, wherein the first outphasing amplifier branch and the second outphasing amplifier branch comprise an equal number of power amplifiers.

15. A wireless communication system, comprising:
a transmitting device comprising an outphasing power management circuit, comprising:
a first outphasing amplifier branch comprising a plurality of first power amplifiers coupled to a plurality of first antenna paths, respectively;
a second outphasing amplifier branch comprising a plurality of second power amplifiers coupled to a plurality of second antenna paths, respectively; and
a controller configured to:
deconstruct an amplitude modulated signal having a time-varying amplitude into a positive term signal having a first signal amplitude and a negative term signal having a second signal amplitude; and
provide the positive term signal and the negative term signal to the first outphasing amplifier branch and the second outphasing amplifier branch, respectively;
wherein the plurality of first power amplifiers is configured to:
generate a plurality of first output signals corresponding to a first output amplitude based on the positive term signal; and
provide the plurality of first output signals to the plurality of first antenna paths, respectively, for transmission in a radio frequency (RF) beam; and
wherein the plurality of second power amplifiers is configured to:
generate a plurality of second output signals corresponding to a second output amplitude based on the negative term signal; and
provide the plurality of second output signals to the plurality of second antenna paths, respectively, for transmission in the RF beam; and
a receiving device configured to:
receive the plurality of first output signals and the plurality of second output signals via a beamforming antenna; and
reconstruct the amplitude modulated signal by combining the plurality of first output signals and the plurality of second output signals.

16. The wireless communication system of claim 15, wherein the plurality of first output signals is not combined with the plurality of second output signals prior to being transmitted in the RF beam.

17. The wireless communication system of claim 15, wherein the positive term signal and the negative term signal are constant-envelope signals each defined by a respective constant voltage envelope corresponding to a peak amplitude of the time-varying amplitude of the amplitude modulated signal.

18. The wireless communication system of claim 17, wherein:
- the plurality of first power amplifiers is configured to be saturated by the respective constant voltage envelope of the positive term signal; and
- the plurality of second power amplifiers is configured to be saturated by the respective constant voltage envelope of the negative term signal.

19. The wireless communication system of claim 18, wherein:
- the first output amplitude of the plurality of first output signals is determined by a first supply voltage provided to the plurality of first power amplifiers; and
- the second output amplitude of the plurality of second output signals is determined by a second supply voltage provided to the plurality of second power amplifiers.

20. The wireless communication system of claim 19, wherein the outphasing power management circuit further comprises:
- a first direct current (DC) to DC (DC-DC) converter configured to provide the first supply voltage to the plurality of first power amplifiers; and
- a second DC-DC converter configured to provide the second supply voltage to the plurality of second power amplifiers.

* * * * *

UNITED STATES PATENT AND TRADEMARK OFFICE
CERTIFICATE OF CORRECTION

PATENT NO. : 10,123,286 B2
APPLICATION NO. : 15/479956
DATED : November 6, 2018
INVENTOR(S) : Nadim Khlat and Alexander Wayne Hietala It is certified that error appears in the above-identified patent and that said Letters Patent is hereby corrected as shown below:

In the Specification

In Column 13, Line 17, replace "terms 132(1)-132(M)" with --terms $\beta_2(1)$-$\beta_2(M)$--.

In Column 14, equation 7, replace

" $A(t)^* \left[ \left( A_p^* e^{jO(t)+jOm(t)*} \sum_{k=1}^{M} \beta_1(k) \right) + A_N^* e^{jO(t)-jOm(t)*} \sum_{k=1}^{M} \beta_2(k) \right]$ ,, with -- $A(t) * \left[ \left( A_p * e^{jO(t)+jOm(t)} * \sum_{k=1}^{M} \beta_1(k) \right) + A_N * e^{jO(t)-jOm(t)} * \sum_{k=1}^{M} \beta_2(k) \right]$ --.

Signed and Sealed this
Eleventh Day of December, 2018

Andrei Iancu
*Director of the United States Patent and Trademark Office*